(12) United States Patent
Pillonnet et al.

(10) Patent No.: US 11,683,036 B2
(45) Date of Patent: Jun. 20, 2023

(54) CAPACITIVE LOGIC CELL WITH COMPLEMENTARY CONTROL

(71) Applicant: Commissariat à l'Énergie Atomique et aux Énergies Alternatives, Paris (FR)

(72) Inventors: Gaël Pillonnet, Grenoble (FR); Hervé Fanet, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 49 days.

(21) Appl. No.: 17/511,347

(22) Filed: Oct. 26, 2021

(65) Prior Publication Data

US 2022/0131541 A1    Apr. 28, 2022

(30) Foreign Application Priority Data

Oct. 27, 2020  (FR) .................................. 2010976

(51) Int. Cl.
*H03K 19/00* (2006.01)
(52) U.S. Cl.
CPC ................. *H03K 19/0019* (2013.01)
(58) Field of Classification Search
None
See application file for complete search history.

(56) References Cited

U.S. PATENT DOCUMENTS

| | | | | |
|---|---|---|---|---|
| 6,507,475 B1* | 1/2003 | Sun | ............... | H01L 27/0805 257/E27.048 |
| 8,363,380 B2* | 1/2013 | Lan | ............... | H01G 5/16 361/281 |
| 9,418,794 B2* | 8/2016 | Kim | ............... | H01G 5/16 |
| 2018/0366272 A1* | 12/2018 | Pillonnet | ............... | H01G 5/16 |
| 2019/0035559 A1* | 1/2019 | Pillonnet | ............... | H03K 19/02 |

FOREIGN PATENT DOCUMENTS

| | | |
|---|---|---|
| EP | 3 182 590 A1 | 6/2017 |
| EP | 3 435 546 A1 | 1/2019 |

OTHER PUBLICATIONS

Preliminary Search Report for French Application No. 2010976, dated Jul. 8, 2021.
Pillonnet et al., Adiabatic capacitive logic: a paradigm for low-power logic. 2017 IEEE International Symposium on Circuits and Systems (ISCAS). May 28, 2017:1-4.

* cited by examiner

*Primary Examiner* — Jany Richardson
(74) *Attorney, Agent, or Firm* — Wolf, Greenfield & Sacks, P.C.

(57) ABSTRACT

A capacitive logic cell with complementary control, including a variable-capacitance electromechanical device having a fixed part and a mobile part, the electromechanical device comprising first, second, third and fourth electrodes mounted on the fixed part, and a fifth electrode mounted on the mobile part, the first electrode being connected to a terminal for supplying a first input logic signal, the second electrode being connected to a terminal for supplying a second input logic signal, complementary to the first input logic signal, the third electrode being connected to a terminal for supplying a first output logic signal, and the fourth electrode being connected to a terminal for supplying a second output logic signal, complementary to the first output logic signal.

14 Claims, 10 Drawing Sheets

CAPACITIVE LOGIC CELL WITH COMPLEMENTARY CONTROL

CROSS-REFERENCE TO RELATED APPLICATIONS

This application claims priority to French application number 2010976, filed Oct. 27, 2020. The contents of which is incorporated herein by reference in its entirety.

TECHNICAL FIELD

The present disclosure relates to the field of adiabatic logic circuits made from variable capacitance capacitors, also called adiabatic capacitive logic circuits.

BACKGROUND ART

The applicant has already proposed example embodiments of elementary adiabatic capacitive logic cells based on variable capacitance capacitors controlled electromechanically, specifically in patent application EP3182590, patent application EP3416175, patent application EP3435546, patent application FR1856243 and in patent application EP3624123.

The use of variable capacitance capacitors controlled electromechanically makes it possible to obtain logic circuits with very low power consumption. In particular, this makes it possible to eliminate leakage currents, a factor limiting conventional adiabatic logic circuits and adiabatic logic circuits made from transistors, in particular.

The above-mentioned patent applications more particularly describe the production of inverting and non-inverting buffer cells, of a certain number of basic combinatorial logic cells as well as of memory cells from variable capacity capacitors controlled electromechanically.

It would be desirable to improve certain aspects of known adiabatic capacitive logic cells, at least in part.

SUMMARY OF INVENTION

Thus, one embodiment provides for a capacitive logic cell with complementary control comprising a variable capacitance electromechanical device comprising a fixed part and a movable part, the electromechanical device comprising first, second, third, and fourth electrodes mounted on the fixed part, and a fifth electrode mounted on the movable part, wherein the first electrode is connected to a terminal for supplying a first input logic signal of the cell, the second electrode is connected to a terminal for supplying a second input logic signal of the cell, complementary to the first input logic signal, the third electrode is connected to a terminal for supplying a first output logic signal of the cell, and the fourth electrode is connected to a terminal for supplying a second output logic signal of the cell, complementary to the first output logic signal.

According to one embodiment, the third and fifth electrodes define a first capacitance that is variable, depending on the position of the movable part, in relation to the fixed part, and the fourth and fifth electrodes define a second capacitance that is variable, depending on the position of the movable part in relation to the fixed part.

According to one embodiment, the position of the movable part in relation to the fixed part depends on the state of the first and second complementary input logic signals applied to the respective first and second electrodes.

According to one embodiment, the movable part is movable in relation to the fixed part so as to vary the distance between the third and fifth electrodes and the distance between the fourth and fifth electrodes without varying the area of the third electrode opposite the fifth electrode or the area of the fourth electrode opposite the fifth electrode.

According to one embodiment, the movable part is movable in relation to the fixed part so as to vary the area of the fifth electrode opposite the third electrode and the area of the fifth electrode opposite the fourth electrode without varying the distance between the third and fifth electrodes or the distance between the fourth and fifth electrodes.

According to one embodiment, the cell further comprises a terminal for supplying a periodic variable supply voltage and a terminal for supplying a reference potential.

According to one embodiment, the fifth electrode is connected to the terminal for supplying the reference potential, and the third and fourth electrodes are connected to the terminal for supplying the periodic variable supply voltage via respective first and second fixed capacitance capacitors.

According to one embodiment, the variable capacitance electromechanical device comprises a sixth electrode mounted on the movable part, the sixth electrode being connected to the terminal for supplying the reference potential and the fifth electrode being connected to the terminal for supplying the periodic variable supply voltage.

According to one embodiment, the movable part comprises a flexible beam anchored to a fixed support, at one end at least.

According to one embodiment, the movable part comprises a mechanical bistable element.

According to one embodiment, the third, fourth, and fifth electrodes are in the shape of interdigitated combs.

According to one embodiment, the electromechanical device further comprises seventh and eighth electrodes mounted on the fixed part, the seventh electrode being connected to a terminal for supplying a third input logic signal of the cell and the eighth electrode being connected to a terminal for supplying a fourth input logic signal of the cell, complementary to the third input logic signal.

According to one embodiment, the electromechanical device further comprises ninth and tenth electrodes mounted on the fixed part, the ninth electrode being connected to a terminal for supplying a third input logic signal of the cell and the eighth electrode being connected to a terminal for supplying a fourth input logic signal of the cell, complementary to the third input logic signal.

Another embodiment provides a logic circuit comprising first and second logic cells as defined above, wherein the first cell has its terminal for supplying the first output logic signal and its terminal for supplying the second output logic signal connected to the terminal for supplying the first input logic signal and to the terminal for supplying the second input logic signal of the second cell, respectively.

BRIEF DESCRIPTION OF DRAWINGS

The foregoing features and advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the implementation of electromechanically controlled variable capacitance devices of the described logic cells has not been detailed. The implementation of such devices is within the scope of the person skilled in the art, starting from the embodiments of the present description, using known methods for producing micro-electro-mechanical systems (MEMS), for example.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

In this description, a conductive plate, beam, or region is defined as a plate, beam, or region made of a material capable of conducting electrical charges; this material may be a conductive material such as a metal, or even a semiconductive material, such as silicon.

In the examples described below, the input and output logic signals of a logic cell correspond to periodic variable voltages, the amplitude of which determines the logic signal value, high or low. Also, pulse logic or dynamic logic relates to the extent to which the logic signal states are only available for a fraction of the clock signal period formed by the cell supply voltage. Unless otherwise specified, a logic signal is understood as a signal that can have only two states: a high state (1 logic), corresponding to a voltage amplitude close to the amplitude of the cell supply voltage, for example, between 1 and 5 volts, for example, or a low state (0 logic), corresponding to a voltage amplitude lower than that of the high state, a voltage amplitude close to 0 volts, for example, lower than 0.5 volts, for example.

Figure 1:
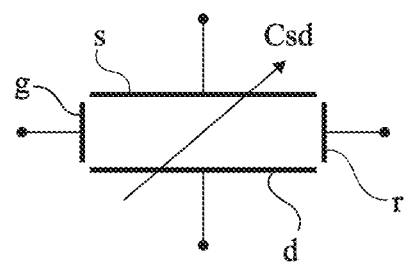
FIG. 1 is a schematic illustration of a four-electrode variable capacitance capacitor.

FIG. 1 is a schematic illustration of an example of a four-electrode variable capacitance capacitor of the type described in the aforementioned patent applications, which can be used to make an adiabatic capacitive logic cell. The capacitor of FIG. 1 comprises two main electrodes, s and d, separated by a dielectric region, and two control electrodes, g and r, electrically insulated from the main electrodes s and d, adapted to receive a control signal in order to vary the capacitance Csd between the main electrodes s and d. More particularly, the aforementioned patent applications describe example embodiments of four-electrode variable capacitance capacitors of the electromechanical type, that is, in which the main electrodes s and d are movable in relation to each other, and the control signal applied between the electrodes r and g is adapted to vary the relative position of the electrodes s and d so as to vary the capacitance Csd. The capacitor of FIG. 1 is a capacitor with positive capacitance variation, that is, the capacitance Csd between its main electrodes s and d is an increasing function of the signal applied between its control electrodes g and r. This is shown as an oblique arrow pointing upward in the representation in FIG. 1.

Figure 2:
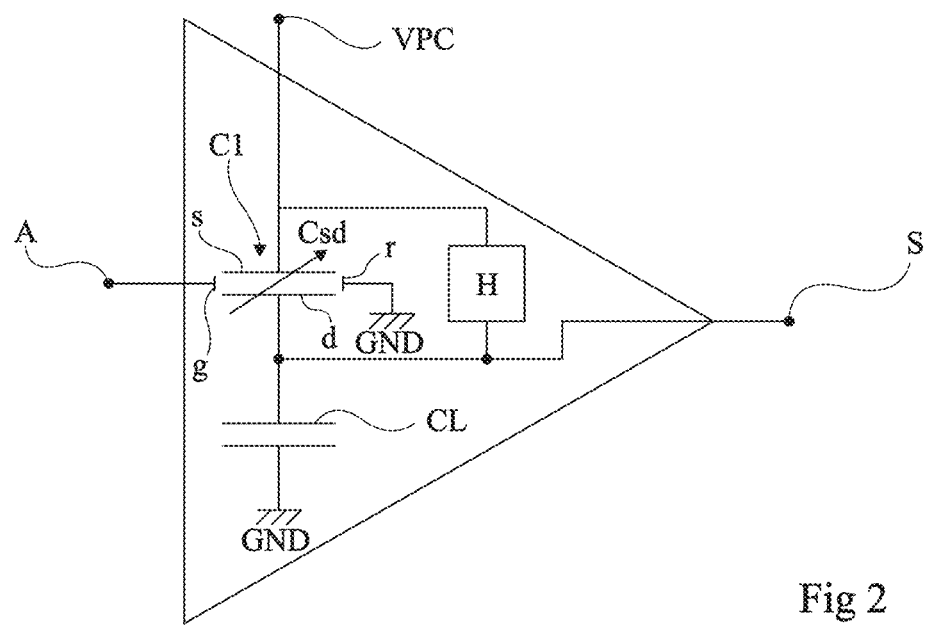
FIG. 2 is an electrical diagram of an example of a buffer cell in adiabatic capacitive logic.

FIG. 2 is an electrical diagram of an example of a buffer cell with adiabatic capacitive logic. The buffer cell in FIG. 2 comprises a four-electrode variable capacitor C1. The capacitor C1 is a positively variable capacitance capacitor, of the type described in connection with FIG. 1, for example. The main electrode s of the capacitor C1 is linked, or connected, to a terminal for supplying a cell supply voltage VPC, referenced in relation to a node GND for supplying a cell reference potential, connected to the ground, for example. The main electrode d of the capacitor C1 is linked, or connected, to a terminal for supplying a cell output voltage S, referenced in relation to the node GND. The control electrode g of the capacitor C1 is linked, or connected, to a terminal for supplying a cell input voltage A, referenced in relation to the node GND. The control electrode r of the capacitor C1 is linked, or connected, to the GND node. For the sake of simplicity, in this description, the signal application or supply terminals and corresponding signals will be referred to by the same references.

FIG. 2 shows a capacitor CL connected between the output node S and the reference node GND, mapping the output capacitance of the cell. In practice, the output capacitance CL may not include any component specifically made and connected to the output node S, but may be the sum of the capacitances of the various elements connected to the node S, including interconnections or a different capacitive logic cell (not shown) whose input may be connected to the node S.

In the example of FIG. 2, the buffer cell further comprises a holding device H, adapted to keep the output voltage S of the cell at a high-level during the transition phases of the cell input voltage A from a high-level to a low-level.

Figure 3:
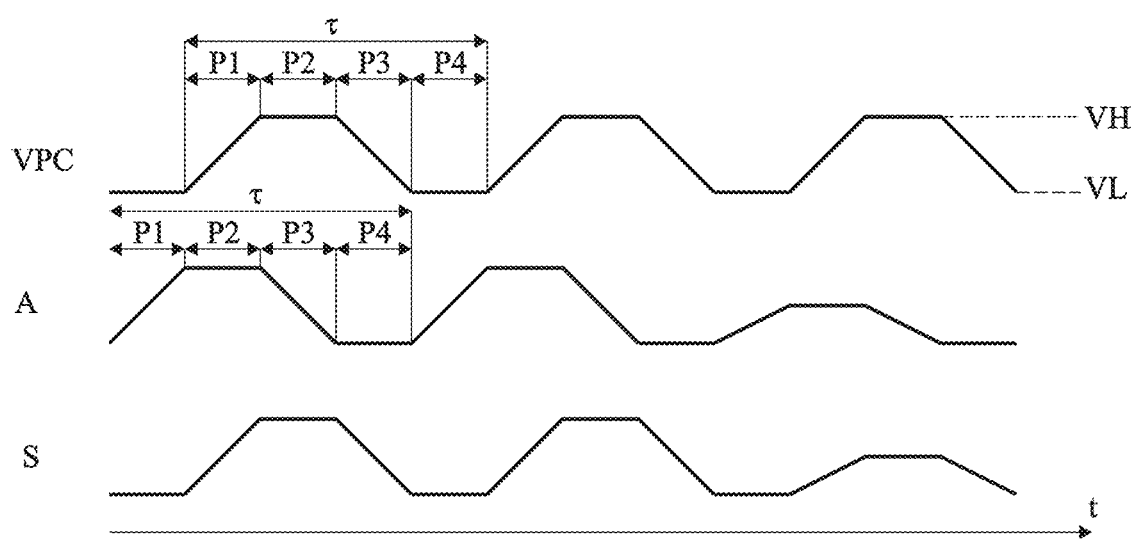
FIG. 3 is a timing diagram illustrating the operation of the cell in FIG. 2.

FIG. 3 is a diagram illustrating the operation of the cell of FIG. 2. Specifically, FIG. 3 illustrates the evolution of the supply voltage VPC, the input voltage A, and the output voltage S of the cell of FIG. 2, depending on the time t (on the x-axis).

The supply voltage VPC is a periodic variable voltage, supplied by a variable voltage source, not shown in FIG. 2. The voltage VPC varies periodically and continuously between a low value VL, between 0 and 2 volts, for example, and a high value VH greater than VL, between 1 and 10 volts, for example. In the example shown, the supply voltage VPC is a trapezoidal voltage. More particularly, in this example, each voltage period VPC comprises four successive phases P1, P2, P3 and P4, of substantially the same duration $T=\square/4$. During the phase P1, the voltage VPC increases linearly from its low value VL to its high value VH. During phase phase P2, the voltage VPC remains approximately constant and equal to its high value VH. During the phase P3, the VPC voltage decreases linearly from its high value VH to its low value VL. During phase phase P4, the voltage VPC remains substantially constant and equal to its low value VL.

The voltages A and S are synchronized with the supply voltage VPC, which also serves as a clock signal. The voltages A and S exhibit a periodic variation in shape, substantially identical to that of the variable supply voltage VPC. The voltages A and S define the respective input and output logic signals of the cell. The input logic signal, respectively output, is in a high state when the amplitude of the periodic variable voltage A, respectively S, is at a high-level, close to the amplitude of the supply voltage VPC, for example, and is at a low-level when the amplitude of the periodic variable voltage A, respectively S, is at a low-level, for example close to 0 volts. The voltage A has a phase advance of the order of $T=\square/4$ on the supply voltage VPC. The voltage S is in phase with the supply voltage VPC.

In the example shown in FIG. 3, the input signal A is in the high state for two successive periods of the supply signal VPC, and then goes to the low state.

The output voltage S depends on the ratio between the variable capacitance Csd of the capacitor C1 controlled by the input voltage A and the fixed capacitance CL. For a logic 0 of the input signal A (voltage A with an amplitude close to 0 volts), the capacitance Csd of the capacitor C1 remains at a low value CsdL, and the voltage pulse S transmitted on the output terminal S of the cell is at a low amplitude level, close to 0 volts, for example. For a logic 1 of the input signal A (voltage A with an amplitude close to the amplitude of the supply voltage VPC), the capacitance Csd of the capacitor C1 increases to a high value CsdH, and a voltage pulse S with a high amplitude level, close to the amplitude of the supply voltage VPC, for example, is obtained at the output terminal S of the cell (through the capacitive divider bridge formed by the capacitances Csd and CL). The holding device H, internal to the buffer cell, makes it possible to maintain a capacitance between the power supply terminals VPC and the output terminals S of the cell during the decay phase of the high-level pulse of the input voltage A of the cell (the phase P3 of the voltage A corresponding to the phase P2 of the voltage VPC), that is substantially equal to the high value CsdH of the capacitance of the capacitor C1, which makes it possible to supply a high-level pulse of the same shape (trapezoidal, in this example) as the power supply voltage VPC at the output of the cell.

In practice, the trapezoidal supply voltage VPC can be approximated by a sinusoidal voltage of period $\square$.

It should be noted that the buffer cell described in relation to FIGS. 2 and 3 is a non-inverting buffer cell, that is, at its output terminal, it copies a signal S having the same logic state as the signal A applied at its input terminal. In a similar way, an inverting buffer cell can be made in adiabatic capacitive logic by simply replacing the capacitor, in the example of FIG. 2, with a positive change in capacitance C1 by a capacitor with a negative change in capacitance.

More generally, various basic logic functions, and in particular the AND, OR, NOT OR, NOT AND functions, or even memory functions, can be made in adiabatic capacitive logic by one or more electromechanically controlled four-electrode variable capacitance capacitors with positive change in capacitance and/or negative change in capacitance, as described in the above-mentioned patent applications.

An improvement in certain aspects of the adiabatic capacitance logic cells described in the above patent applications is sought herein.

According to one aspect of the embodiments described, the implementation of complementary controlled adiabatic logic cells is contemplated here, that is, of cells comprising two separate input terminals, receiving a first input logic signal and a second input logic signal, respectively, complementary to the first signal, and two separate output terminals, providing a first output logic signal and a second output logic signal, respectively, complementary to the first signal. Each cell is implemented by a single variable capacitance microelectromechanical device comprising a fixed part and a mobile part. The use of complementary logic signals to drive the same microelectromechanical device significantly reduces the voltage levels required to switch the device between its two states.

Figure 4:
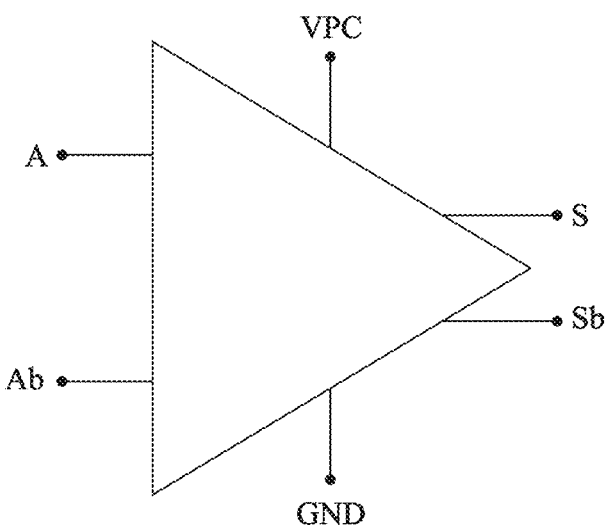
FIG. 4 is a schematic illustration of an example of a buffer cell in adiabatic capacitive logic according to one embodiment.

FIG. 4 is a schematic illustration of an example buffer cell with complementary adiabatic capacitive logic control.

The cell of FIG. 4 comprises two input terminals intended to receive a first input logic signal A and a second input logic signal Ab, respectively, complementary to the signal A. The cell of FIG. 4 also comprises two output terminals intended to supply a first output logic signal S, and a second output logic signal Sb, respectively, complementary to the signal S. The cell of FIG. 4 also comprises a terminal for supplying a supply voltage VPC to the cell, referenced in relation to a node GND for supplying a reference potential to the cell, connected to the ground, for example.

Figure 5:
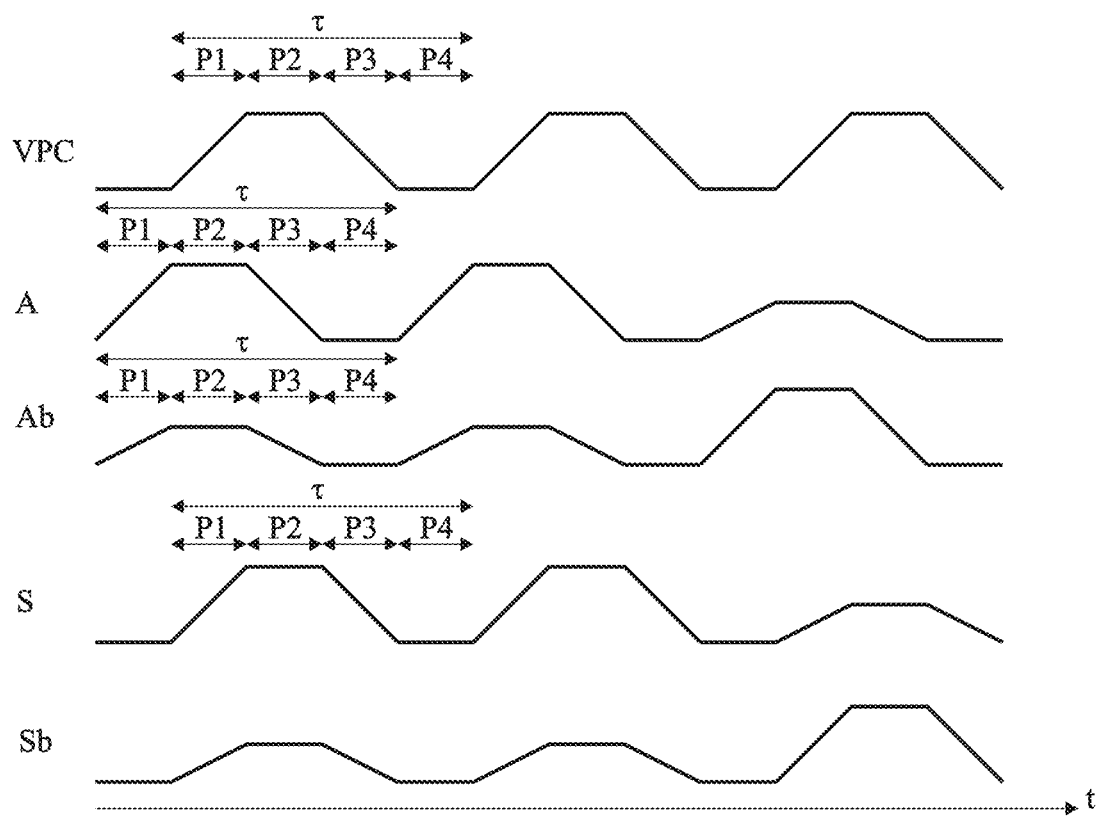
FIG. 5 is a timing diagram illustrating the operation of the cell of FIG. 4.

FIG. 5 is a diagram illustrating the operation of the cell of FIG. 4. More particularly, FIG. 5 illustrates the evolution of the supply voltage VPC, the input voltages A and Ab and the output voltages S and Sb of the cell of FIG. 4, depending on time t (on the x-axis).

The supply voltage VPC is a periodic variable voltage, identical or similar to that described above in connection with FIG. 3. Similarly, the voltages A and S are the same or similar to that described above in connection with FIG. 3.

The voltages Ab and Sb are also synchronized to the supply voltage VPC, and each exhibit a periodic variation substantially identical in form to that of the variable supply voltage VPC. The voltages Ab and Sb define an input logic signal complementary to the signal A and an output logic signal complementary to the signal S, respectively. In other words, the signal Ab is in the low state when the signal A is in the high state, and in the high state when the signal A is in the low state. Similarly, the signal Sb is low when the signal S is high, and high when the signal Sb is low Like the voltage A, the voltage Ab has a phase advance of the order of T=□/4 on the supply voltage VPC. The voltage Sb is in phase with the supply voltage VPC.

Figure 6:
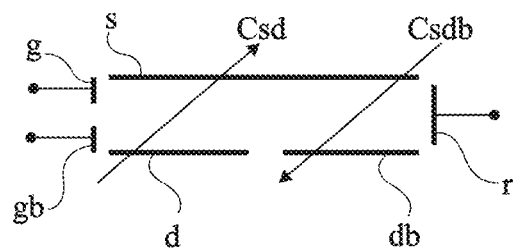
FIG. 6 is a schematic illustration of a six-electrode variable capacitance device.

FIG. 6 is a schematic illustration of a six-electrode variable capacitance microelectromechanical device that can be used to implement a complementary controlled adiabatic capacitive logic cell of the type described in connection with FIG. 4.

The device of FIG. 6 comprises three main electrodes, s, d, and db, electrically insulated from each other. The electrodes s and d define a first variable capacitance Csd of the device. The electrodes s and db define a second variable capacitance Csdb of the device. The device of FIG. 6 further comprises two control electrodes, g and gb, electrically insulated from each other and electrically insulated from the main electrodes, adapted to receive control signals to vary the capacitances Csd and Csdb. The device of FIG. 6 further includes a reference electrode, r, to which signals applied to the electrodes g and gb are referenced.

The device of FIG. 6 is an electromechanically controlled device comprising a part that is fixed and a part that is movable (in relation to the fixed part). In this example, the electrodes g, gb, d, and db are mounted on the fixed part, and the electrodes s and r are mounted on the movable part. The control signals applied between the electrodes g and r on the one hand, and between the electrodes gb and r on the other hand, allow the relative position of the electrode s to be varied in relation to the electrodes d and db, and thus the value of the capacitances Csd and Csdb (in a complementary way). More particularly, in this example, when a high-level logic signal and a low-level logic signal (referenced in relation to the electrode r) are applied to the electrodes g and gb respectively, the capacitances Csd and Csdb will have a high value CsdH and a low value CsdbL, respectively. Conversely, when a low-level logic signal and a high-level logic signal are applied to the electrodes g and gb, respectively, the capacitances Csd and Csdb will respectively have a low value CsdL, substantially equal to the value CsdbL, for example, and a high value CsdbH, substantially equal to the value CsdH, for example.

Example embodiments of the device of FIG. 6 will be described in more detail below.

Figure 7:
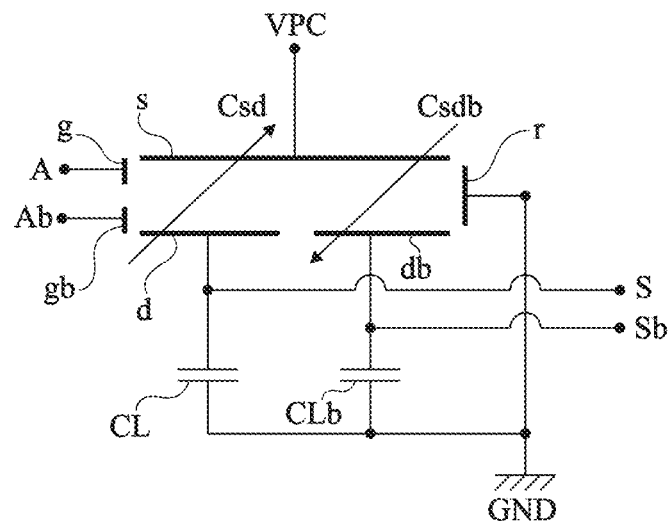
FIG. 7 is an electrical schematic of an example embodiment of the buffer cell of FIG. 4 using the variable capacitance device of FIG. 6.

FIG. 7 is an electrical diagram of an example embodiment of the buffer cell of FIG. 4 using the variable capacitance device of FIG. 6.

In this example, the main electrode s of the device of FIG. 6 is linked or connected to a terminal for supplying the cell supply voltage VPC. The main electrodes d and db of the device of FIG. 6 are linked or connected to an output signal supply terminal S and an output signal supply terminal Sb of the cell, respectively. The voltages S and Sb, defining the output logic signals of the cell, are referenced in relation to the node GND. The control electrodes g and gb of the device in FIG. 6 are linked or connected to a terminal for supplying the input signal A of the cell and to a terminal for supplying the input signal Ab of the cell, respectively. The voltages A and Ab defining the cell's input logic signals are referenced in relation to the node GND. The reference electrode r of the device in FIG. 6 is connected to the node GND, for example.

In FIG. 7, the capacitor CL and capacitor CLb are represented, connected between the output node S and the reference node GND and between the output node Sb and the reference node GND, respectively, showing the cell output capacitances. In practice, the output capacitances CL and CLb may not be components specifically made and connected to the output nodes S and Sb, but correspond to the sum of capacitances of the various elements connected to the node S and the node Sb respectively, in particular interconnections or even a different capacitive logic cell (not shown) with complementary control, whose complemented inputs may be connected to the nodes S and Sb, respectively.

It should be noted that the buffer cell described in relation to FIG. 7 is a non-inverting buffer cell, that is, it copies signals at its two output terminals S and Sb that have the same respective logic state as the complementary signals applied on its input terminals A and Ab. Similarly, an inverting buffer cell of adiabatic capacitive logic with complementary control can be made by inverting the input terminals A and Ab (that is, by connecting the terminals A and Ab to the electrodes gb and g, respectively) or the output terminals S and Sb (i.e. by connecting the terminals S and Sb to the electrodes db and d, respectively), or by replacing the positive capacitance variation device of FIG. 6 with a negative capacitance variation device.

Figure 8:
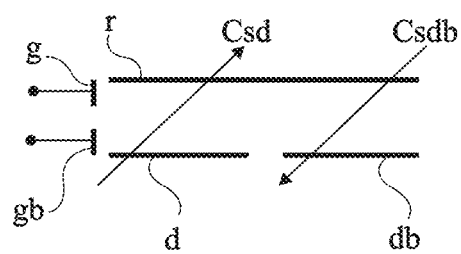
FIG. 8 is a schematic illustration of a five-electrode variable capacitance device.

FIG. 8 is a schematic illustration of a five-electrode variable capacitance microelectromechanical device that can be used to make a complementary-controlled adiabatic capacitive logic cell, of the type described in connection with FIG. 4, for example. The device in FIG. 8 differs from the device in FIG. 6 primarily in that the electrodes s and r are combined in the device in FIG. 8. The corresponding electrode will be referred to as r in the description relating to FIG. 8.

Thus, the device of FIG. 8 comprises two main electrodes, d and db, electrically insulated from each other, and a reference electrode, r, electrically insulated from the electrodes d and db. The electrodes r and d define a first variable capacitance Csd of the device. The electrodes r and db define a second variable capacitance Csdb of the device. The device of FIG. 8 further comprises two control electrodes, g and gb, electrically insulated from each other and electrically insulated from the main electrodes d, db and r, adapted to receive control signals to vary the capacitances Csd and Csdb. The signals applied to the electrodes g and gb are referenced in relation to the electrode r.

The device of FIG. 8 is an electromechanically controlled device comprising a fixed part and a mobile part. In this example, the electrodes g, gb, d, and db are mounted on the fixed part, and the electrode r is mounted on the movable part. The control signals applied between the electrodes g and r on the one hand, and between the electrodes gb and r on the other hand, allow the relative position of the electrode r in relation to the electrodes d and db, and thus the value of the capacitances Csd and Csdb to be varied. More particularly, in this example, when a high-level logic signal and a low-level logic signal (referenced in relation to the electrode r) are applied to the electrodes g and gb respectively, the capacitances Csd and Csdb assume a high value CsdH and a low value CsdbL respectively. Conversely, when a low-level logic signal and a high-level logic signal are applied to the electrodes g and gb, respectively, the respective capacitances Csd and Csdb assume a low value CsdL, substantially equal to the value CsdbL, for example, and a high value CsdbH, substantially equal to the value CsdH for example.

Example embodiments of the device of FIG. 8 will be described in more detail below.

Figure 9:
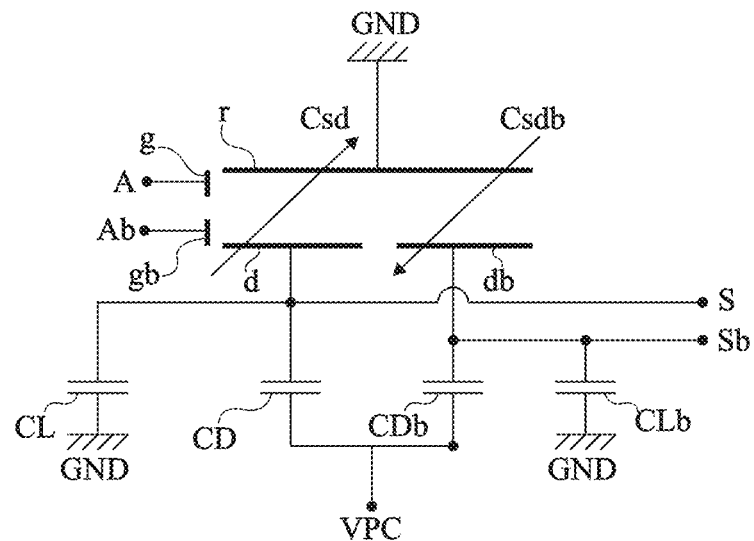
FIG. 9 is an electrical schematic of an example embodiment of the buffer cell of FIG. 4 using the variable capacitance device of FIG. 8.

FIG. 9 is an electrical diagram of an example embodiment of the buffer cell of FIG. 4 using the variable capacitance device of FIG. 8.

In this example, the cell comprises two fixed capacitors CD and CDb, identical or similar (except for manufacturing dispersions), for example. The cell supply voltage VPC is applied to the main electrodes d and db of the device of FIG. 8 through the capacitors CD and CDb, respectively. Specifically, the capacitor CD has a first electrode connected to the electrode d, for example, and a second electrode connected to the voltage application terminal VPC, for example. The capacitor CDb has a first electrode linked or connected to the electrode db, for example, and a second electrode linked or connected to the voltage application terminal VPC, for example.

The main electrodes d and db of the device of FIG. 8 are further linked or connected to an output signal supply terminal S and an output signal supply terminal Sb of the cell, respectively. The control electrodes g and gb of the device of FIG. 8 are linked or connected to a terminal for supplying an input signal A of the cell, and to a terminal for supplying an input signal Ab of the cell, respectively. The control electrode r of the device in FIG. 8 is linked or connected to the node GND. In this example, the voltages A, Ab, S, Sb, and VPC are referenced in relation to the node GND.

In FIG. 9, a capacitor CL and a capacitor CLb have been shown, respectively connected between the output node S and the reference node GND, and between the output node Sb and the reference node GND, schematizing the output capacitances of the cell. In practice, the output capacitances CL and CLb may not comprise components specifically made and connected to the output nodes S and Sb, but correspond to the sum of capacitances of the various elements connected to the node S and the node Sb respectively, including interconnections or even a different capacitive logic cell (not shown) with complementary control, whose complemented inputs may be connected to the nodes S and Sb respectively.

As in the example of FIG. 7, the buffer cell described in connection with FIG. 9 is a non-inverting buffer cell. Similarly, an inverting buffer cell of adiabatic capacitive logic with complementary control can be made by inverting the input terminals A and Ab or the output terminals S and Sb, or replacing the positive capacitance variation device of FIG. 8 with a negative capacitance variation device.

An advantage of the cell of FIG. 9 is that a five-electrode variable capacitance microelectromechanical device of the type described in connection with FIG. 8 is simpler to implement than a six-electrode device of the type described in connection with FIG. 6. On the other hand, capacitors CD and CDb must be provided.

More generally, various basic logic functions, and, in particular, the AND, OR, NOT OR, NOT AND functions, or even memory functions, can be made in adiabatic capacitive logic with complementary control by a single variable capacitance microelectromechanical device of the type described in connection with FIG. 6 or 8. Example embodiments of such functions will be described in more detail below.

Figure 10:
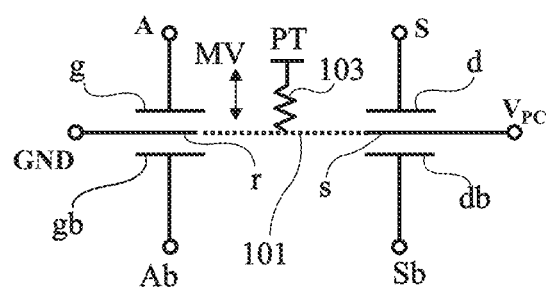
FIG. 10 is a schematic illustration of an example embodiment of the six-electrode variable capacitance device of FIG. 6.

FIG. 10 is a schematic illustration of an example embodiment of the six-electrode variable capacitance device of FIG. 6.

The device of FIG. 10 comprises a fixed structure on which the fixed electrodes g, gb, d, and db are mounted, and a movable structure on which the movable electrodes r and s are mounted. In this example, the electrodes g, gb, d, db, s and r each have the shape of a substantially flat conductive plate. In this example, the electrodes g, gb, d, db, s and r are substantially parallel to each other. The electrodes g and gb are arranged opposite each other, that is, they have a common surface projected along an axis that is orthogonal to the conductive plates. The electrode r is arranged between the electrodes g and gb, opposite the electrodes g and gb. Similarly, the electrodes d and db are arranged opposite each other, and the electrode s is arranged between the electrodes d and db, opposite the electrodes d and db. In the example shown, the electrodes g and d on the one hand and gb and db on the other hand are substantially coplanar. In addition, in this example, the electrodes r and s are substantially coplanar. However, the embodiments described are not limited to this particular case. In the example shown in FIG. 10, the movable structure comprises an electrically insulating member 101, mechanically connecting the movable electrodes r and s, electrically insulating them from each other. In this example, the assembly comprising the movable electrodes r and s and the electrically insulating element 101 is mechanically connected to a point PT of the fixed structure, also known as an anchor point, via a spring 103.

In the example shown in FIG. 10, the movable structure is adapted to move in a direction MV, orthogonal to the electrodes g, gb, r, d, db, and s, under the effect of the electrostatic force exerted by the electrode g or gb on the electrode r. Specifically, in the example shown, when a high-level voltage is applied to the electrode g and a low-level voltage is applied to the electrode gb (the signals A and Ab in the high and low states, respectively), the electrode r is attracted to the electrode g by electrostatic effect. As a result, the electrode s moves towards the electrode d and away from the electrode db. Thus, the capacitance Csd (between the electrode s and the electrode d) increases and the capacitance Csdb (between the electrode s and the electrode db) decreases. Conversely, when a low-level voltage is applied to the electrode g and a high-level voltage is applied to the electrode gb (the signals A and Ab in the low and high states respectively), the electrode r is attracted to the electrode gb by electrostatic effect. As a result, the electrode s moves towards the electrode db and away from the electrode d. Thus, the capacitance Csd decreases and the capacitance Csdb increases. Electrically insulating layers, not shown, may be provided between the movable electrodes and the fixed electrodes, to avoid any risk of short circuit between said electrodes.

Figure 11:
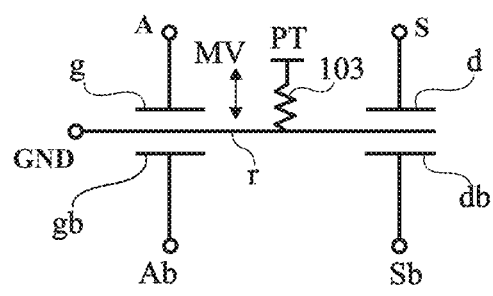
FIG. 11 is a schematic illustration of an example embodiment of the five-electrode variable capacitance device of FIG. 8.

FIG. 11 is a schematic illustration of an example embodiment of the five-electrode variable capacitance device of FIG. 5.

The device of FIG. 11 differs from the device of FIG. 10 essentially in that the assembly in the example of FIG. 11 comprising the electrode s, the electrode r, and the electrically insulating member 101 (FIG. 10), is replaced by a single conductive plate forming the electrode r. Thus, in this example, the electrode r is arranged between the electrodes g and gb, opposite the the electrodes g and gb, and further extends between the electrodes d and db, opposite the electrodes d and db. In this example, the movable electrode r is mechanically connected to a point PT of the fixed structure via a spring 103.

As in the example of FIG. 10, the movable structure is adapted to move in a direction MV, orthogonal to the the electrodes g, gb, r, d and db, under the effect of the electrostatic force exerted by the the electrode g or gb on the the electrode r. Specifically, in the example shown, when a high-level voltage is applied to the electrode g and a low-level voltage is applied to the electrode gb (the signals A and Ab in the high and low states, respectively), the electrode r is attracted to the electrode g by electrostatic effect. As a result, the electrode r moves towards the electrode d and away from the electrode db. Thus, the capacitance Csd (between the electrode r and the electrode d) increases and the capacitance Csdb (between the electrode r and the electrode db) decreases. Conversely, when a low-level voltage is applied to the electrode g and a high-level voltage is applied to the electrode gb (the signals A and Ab in the low and high states, respectively), the electrode r is attracted to the electrode gb by electrostatic effect. As a result, the electrode r moves towards the electrode db and away from the electrode d. Thus, the capacitance Csd decreases and the capacitance Csdb increases.

Figure 12A:
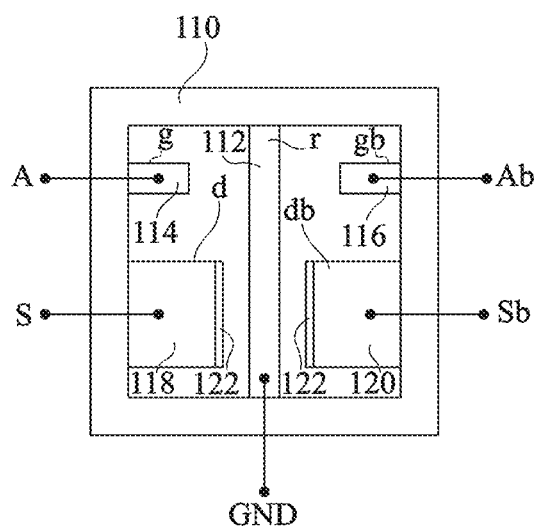
FIG. 12A further illustrates another example embodiment of the five-electrode variable capacitance device of FIG. 8.

FIG. 12A illustrates another example embodiment of the five-electrode variable capacitance device of FIG. 8 in more detail.

The device in FIG. 12A comprises a fixed support frame 110. In this example, the movable electrode r is formed by a flexible conductive beam 112, anchored at one end at least (in the example shown, at both ends) to the support 110. The control electrodes g and gb are formed by two conductive regions 114 and 116, respectively, of substantially the same shape and dimensions, for example, mechanically integral with the support frame 110 and respectively arranged on either side of the beam 112, at a distance from the beam 112. The main electrodes d and db are formed by two respective conductive regions 118 and 120, substantially of the same shape and dimensions, for example, mechanically integral with the support frame 110 and respectively arranged on either side of the beam 112 at a distance from the beam 112. In this example, the region 118 (electrode d) is arranged on the same side of beam 112 as the region 114 (electrode g), and the region 120 is arranged on the same side of the beam 112 as the region 116.

In this example, at rest, that is, in the absence of any electrical polarization, the distance between the region 114 (electrode g) and the beam 112 (electrode r) is substantially equal to the distance between the region 116 (electrode gb) and the beam 112 (electrode r). Furthermore, in this example, at rest, the distance between the region 118 (electrode d) and the beam 112 (electrode r) is substantially equal to the distance between the region 120 (electrode db) and the beam 112 (electrode r). FIG. 12A shows the device in this rest configuration.

In the example shown, at rest, the distance between the region 114 (electrode g) and the flexible beam 112 (electrode r) is greater than the distance between the region 118 (electrode d) and the beam 112 (electrode r). Similarly, the distance between the region 116 (electrode gb) and the flexible beam 112 (electrode r) is greater than the distance between the region 120 (electrode db) and the beam 112 (electrode r). Furthermore, in the example shown, the area of the regions 114 and 116 opposite the beam 112 is less than the area of the regions 118 and 120 opposite the beam 112.

In the example shown in FIG. 12A, the face of the region 118 opposite the beam 112 and the face of the region 120 opposite the beam 112 are coated with a dielectric layer 122, of silicon oxide for example, to prevent short circuits between the electrodes d or db and the electrode r during deformation of beam 112. In a variant, the layer 122 may cover all the electrodes.

The support frame 110 may be made of an electrically insulating material such as silicon oxide, or a conductive or semiconductive material such as silicon. In the case where the frame 110 is made of a conductive or semiconductive material, electrically insulating regions, not shown, may be provided at the interface between the regions 114, 116, 118, 120 respectively and the support frame 110, so as to electrically insulate the the respective electrodes g, gb, d, and db of the support frame 110. The flexible beam 112 may be electrically connected to the support frame 110, or may be electrically insulated from the support frame 110.

Figure 12B:
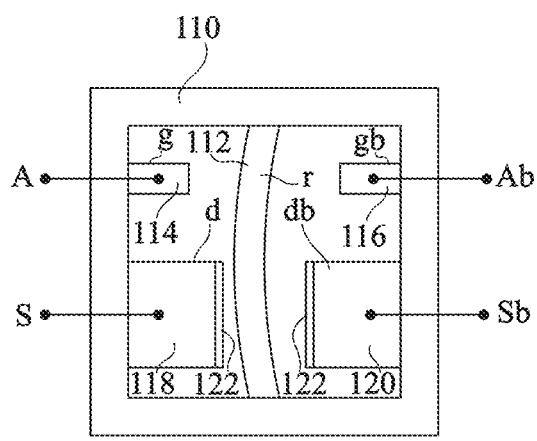
FIG. 12B illustrates the operation of the device of FIG. 12A.
Figure 12C:
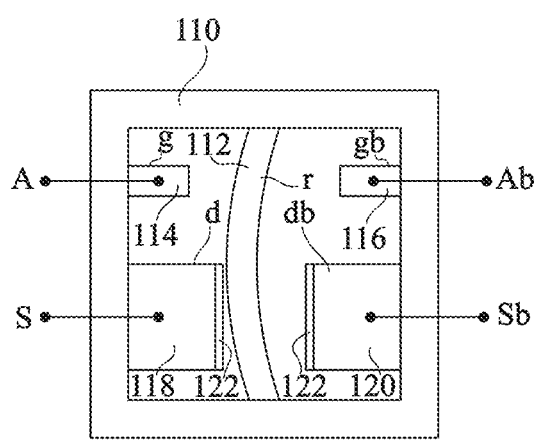
FIG. 12C illustrates the operation of the device of FIG. 12A.

FIGS. 12B and 12C show the device of FIG. 12A in two other operating configurations.

For illustrative purposes, it is assumed here that the input logic signals A and Ab are the high and low states, respectively.

When the voltages A and Ab are both in the low state (phase P4 of the voltages A and Ab), the device is in its rest position, as illustrated in FIG. 12A. The capacitance Csd between the electrodes d and r is then substantially equal to the capacitance Csdb between the electrodes db and r.

During the phase P1 of the voltages A and Ab, the voltage A (logic 1) applied to the electrode g becomes greater than the voltage Ab (logic 0) applied to the electrode gb. Thus, the region 114 creates an attractive force greater than the attractive force generated by the region 116. As a result, the flexible beam 112 deforms, moving toward the regions 112 and 118 and away from the regions 116 and 120. This leads to an increase in the capacitance Csd and a decrease in the capacitance Csdb. This configuration is illustrated in FIG. 12B.

During the phase P2 of the A and Ab voltages, the difference between the voltages A and Ab is maximum. In addition, a high-level pulse appears at the output the electrode d (the phase P1 of the signal S), while the output the electrode db remains at a low-level (the phase P1 of the signal Sb). As a result, the region 118 creates an attractive force greater than the attractive force generated by the region 120. The flexible beam 112 is thus kept as close to the region 118 as possible and as far away from the region 120 as possible. The capacitance Csd is thus at its high value CsdH and the capacitance Csdb is at its low value CsdbL.

The system is maintained in this position during the phase P3 of the signals A and Ab, and then returns to its initial position during the phase P4 of the signals A and Ab, recovering all or part of the displacement energy of the beam 112 via the supply voltage VPC, ensuring a so-called adiabatic operation.

A similar (symmetrical) operation is obtained when the logic signals A and Ab are in the low and high states, respectively.

It should be noted that the device of FIG. 12A forms a five-electrode microelectromechanical device that can be integrated into a cell of the type described in connection with FIG. 9. In a variant, the flexible beam 112 may support two disjoint electrodes r and s, arranged between the electrodes g and gb and between the electrodes d and db, respectively. This results in a six-electrode device that can be integrated into a cell of the type described in connection with FIG. 6 or 7.

Figure 13:
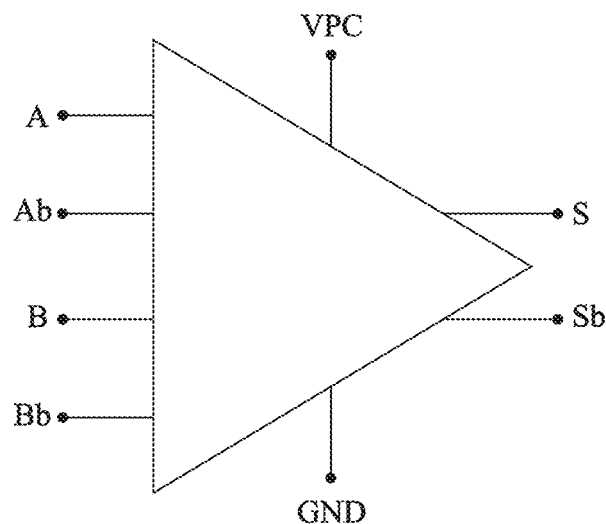
FIG. 13 is a schematic illustration of an example of a combinational cell with adiabatic capacitive logic according to one embodiment.

FIG. 13 is a schematic illustration of an example combinational cell with adiabatic capacitive logic according to one embodiment.

The cell of FIG. 13 comprises four input terminals intended to receive, respectively:
a first input logic signal A;
a second input logic signal Ab, complementary to signal A; and
a third input logic signal B, distinct from signal A; and
a fourth input logic signal Bb, complementary to signal B.

The cell of FIG. 13 also comprises two output terminals respectively intended to supply a first output logic signal S, and a second output logic signal Sb, complementary to the signal S. The cell of FIG. 13 also comprises a terminal for supplying a supply voltage VPC to the cell, referenced in relation to a node GND for supplying a reference potential to the cell.

The signals A, Ab, and VPC are the same or similar to that described above in connection with FIG. 5. The signals B and Bb are similar to the signals A and Ab, except that they may have different logic levels than the signals A and Ab. In other words, the signals B and Bb define a complemented input logic signal that can take on different values than the complemented input logic signal defined by the signals A and Ab. Like the signals A and Ab, the signals B and Bb are in phase advance of the order of T=☐/4 on the VPC supply voltage. The signals S and Sb define a complemented output logic signal, whose logic state corresponds to a combination of the complemented input logic signals A, Ab and B, Bb. In other words, the logic signal S is a logic combination of the signals A and B, and the signal Sb is the logic complement of the signal S. As in the previous examples, the signals S and Sb are in phase with the supply voltage VPC. The logic function implemented by the cell in FIG. 13 is an AND function, an OR function, a NOT AND function, a NOT OR function, for example, or any other logic function with two inputs and one output.

Figure 14:
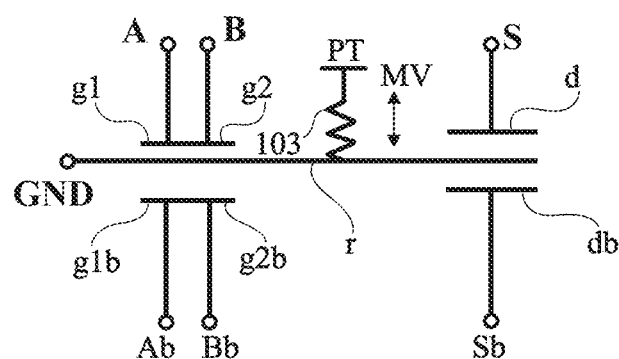
FIG. 14 is a schematic illustration of an example embodiment of a seven-electrode variable capacitance device for producing a combinatorial cell of the type described in connection with FIG. 13.

FIG. 14 is a schematic illustration of one example embodiment of a variable capacitance microelectromechanical device for producing a combinatorial cell of the type described in connection with FIG. 13. In this example, the microelectromechanical device is adapted to implement an OR function.

The device of FIG. 14 is a seven-electrode device. It comprises a fixed structure on which six fixed electrodes g1, g1b, g2, g2b, d and db are mounted, and a movable structure on which a reference electrode r is mounted. In this example, the electrodes g1, g1b, g2, g2b, d, db, and r each have the shape of a substantially flat conductive plate. In this example, the electrodes g1, g1b, g2, g2b, d, db and r are substantially parallel to each other. The electrodes g1 and g1b are arranged opposite each other. Similarly, the electrodes g2 and g2b are arranged opposite each other. The electrode r extends between the electrodes g1 and g1b, opposite the electrodes g1 and g1b, and between the electrodes g2 and g2b, opposite the electrodes g2 and g2b. In the example shown in FIG. 14, the electrodes g1 and g2 are arranged on the upper side of the electrode r, and the electrodes g1b and g2b are arranged on the lower side of the electrode r. As an example, the distance between the electrodes g1 and r is substantially the same as the distance between the electrodes g2 and r. Similarly, the distance between the electrodes g1b and r may be substantially identical to the distance between the electrodes g2b and r. Similarly to that described in connection with FIG. 5, the electrodes d and db are arranged opposite each other on either side of the electrode r. More particularly, in this example, the electrode d is arranged on the upper side of the electrode r and the electrode db is arranged on the lower side of the electrode r. In this example, in the rest position (in the absence of any electrical polarization), the electrodes g1 and g2 are closer to the electrode r than the electrodes g1b and g2b. Furthermore, in this example, in the rest position, the capacitance Csd between the electrode r and the electrode d is at its high value CsdH, and the capacitance Csdb between the electrode r and the electrode db is at its low value CsdbL. In the example shown, the electrodes g1, g2, and d on the one hand, and g1b, g2b, and db on the other hand, are substantially co-planar. However, the embodiments described are not limited to this particular case. In this example, the movable electrode r is mechanically connected to a point PT of the fixed structure via a spring 103.

In the example of FIG. 14, the electrodes g1 and g1b are intended to receive the input logic signals A and Ab, respectively, and the electrodes g2 and g2b are intended to receive input logic signals B and Bb, respectively. In addition, the electrodes d and db are intended to provide the output logic signals S and Sb, respectively. The electrode r is intended to be connected to an application node of a reference potential GND of the cell. Similar to that described in connection with FIG. 9, the cell supply voltage VPC can be applied to the electrodes d and db via fixed capacitance capacitors.

The movable structure is adapted to move only (or preferentially) in a direction MV, orthogonal to the electrodes g1, g1b, g2, g2b, r, d and db, due to the electrostatic force exerted by the electrodes g1 and g2 or g1b and g2b on the electrode r. In the example of FIG. 14, only the combination of signals A=B=0 (and thus Ab=Bb=1) allows the mobile structure to be moved downwards, and thus to place the capacitances Csd and Csdb at a low value CsdL and at a high value CsdbH, respectively, and thus the output signals S and Sb in the logic state 1 and in the logic state 0, respectively. This corresponds to implementing a logic function OR (S=A+B).

It should be noted that the device of FIG. 14 can be replaced by a device with eight electrodes by differentiating the electrode r (placed between the electrodes g1, g2 and g1b, g2b) from an electrode s (placed between the electrodes d and db) on the mobile part, in a manner similar to that described above in relation to FIGS. 6, 7 and 10. In this case, the supply voltage VPC can be applied directly to the electrode s.

Figure 15:
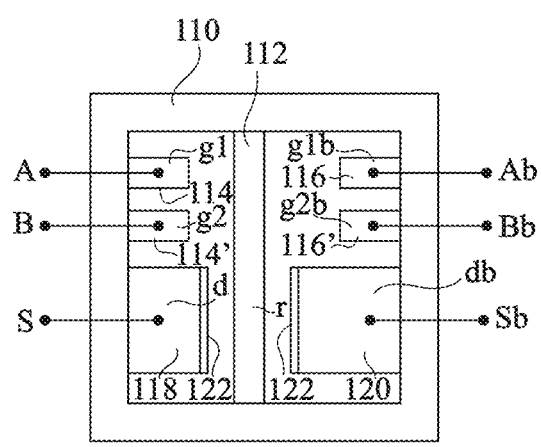
FIG. 15 illustrates in greater detail another example embodiment of a seven-electrode variable capacitance device for producing a combinatorial cell of the type described in relation to FIG. 13.

FIG. 15 illustrates in more detail another example embodiment of a seven-electrode variable capacitance device for implementing a combinatorial cell of the type described in connection with FIG. 13.

The device of FIG. 15 comprises the same elements as the device of FIG. 12A, arranged in substantially the same manner.

The device of FIG. 15 further comprises two conductive regions 114' and 116', with substantially the same shape and dimensions as the respective regions 114 and 116, for example, mechanically integral with the support frame 110 and arranged respectively on either side of the beam 112, at a distance from the beam 112. In this example, the region 114' is arranged on the same side of the beam 112 as the region 114, and the region 116' is arranged on the same side of the beam 112 as the region 116. In the example of FIG. 15, in the rest position, the distance between the region 114 and the beam 112 is less than the distance between the region 116 and the beam 112, and the distance between the region 114' and the beam 112 (substantially the same as the distance between the region 114 and the beam 112, for example), is less than the distance between the region 116' and the beam 112 (substantially the same as the distance between the region 116 and the beam 112, for example).

In the example shown in FIG. 15, the electrodes g1 and g1b are formed by the conductive regions 114 and 116, respectively, and the electrodes g2 and g2b are formed by the conductive regions 114' and 116', respectively.

The operation of the device in FIG. 15 is similar to that in FIGS. 12A, 12B, and 12C, except that, in the example of FIG. 15, the signals A and B must both be in the logic state 0 (with the signals Ab and Bb then being in the logic state 1) in order to have the flexible beam 112 switch to the right, and thus the output logic signal S to the logic state 0 (and the logic signal Sb to the state 1). This corresponds to the implementation of a logic function OR (S=A+B).

The device of FIG. 15 can also be used to implement a function NOT OR by simply reversing the connection of the electrodes d and db, that is, by connecting the terminal supplying the output signal S to the electrode db and the terminal supplying the output signal Sb to the electrode d. This also applies to the device in FIG. 14.

It will be noted that the device of FIG. 15 forms a seven-electrode microelectromechanical device, wherein the supply voltage VPC can be applied to the electrodes d and db via fixed capacitance capacitors in a manner similar to that described above in connection with FIG. 9. In a variant, the flexible beam 112 may support two disjoint electrodes r and s, arranged between the electrodes g1, g2 and g1b, g2b and between the electrodes d and db, respectively. This results in an eight-electrode device in which the supply voltage VPC can be applied directly to the electrode s in a manner similar to that described above in connection with FIG. 7.

Figure 16:
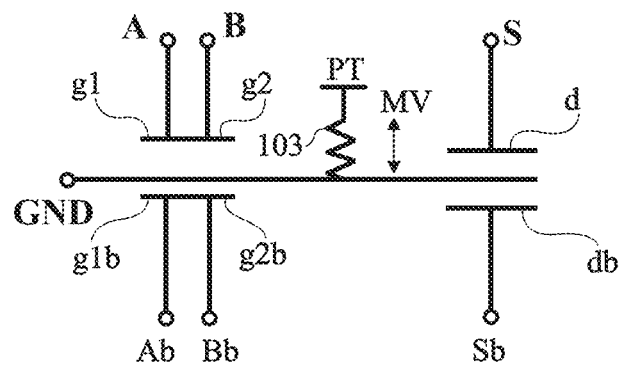
FIG. 16 is a schematic illustration of another example of a seven-electrode variable capacitance device for producing a combinatorial cell of the type described in connection with FIG. 13.

FIG. 16 is a schematic illustration of another example embodiment of a variable capacitance microelectromechanical device for implementing a combinational cell of the type described in connection with FIG. 13. In this example, the microelectromechanical device is adapted to implement a function AND.

The device of FIG. 16 is similar to the device of FIG. 14, except that, in the example of FIG. 16, in the rest position, the electrodes g1b and g2b are closer to the electrode r than the electrodes g1 and g2. Also, in this example, in the rest position, the capacitance Csd between the electrode r and the electrode d is at its low value CsdL, and the capacitance Csdb between the electrode r and the electrode db is at its high value CsdbH.

In the example of FIG. 16, only the combination of signals A=B=1 (and thus Ab=Bb=0) allows the mobile structure to be moved upwards, and thus to place the capacitances Csd and Csdb at a high value CsdH and at a low value CsdbL respectively, and thus the output signals S and Sb in the logic state 1 and the logic state 0 respectively. This corresponds to the implementation of a logic function AND (S=A.B).

It should be noted that the device of FIG. 16 can be replaced by an eight-electrode device by differentiating the electrode r (placed between the electrodes g1, g2 and g1b, g2b), on the moving part, from an the electrode s (placed between the electrodes d and db), in a manner similar to that described above. In this case, the supply voltage VPC can be applied directly to the electrode s.

Figure 17:
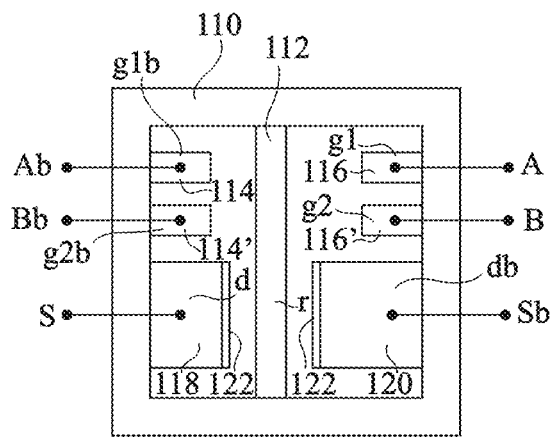
FIG. 17 illustrates in more detail another example embodiment of a seven-electrode variable capacitance device for producing a combinatorial cell of the type described in connection with FIG. 13.

FIG. 17 illustrates in more detail another example of one embodiment of a seven-electrode variable capacitance device for implementing a combinational cell of the type described in connection with FIG. 13.

The device of FIG. 17 comprises the same elements as the device of FIG. 15, arranged in substantially the same manner.

The device of FIG. 17 differs from the device of FIG. 15 primarily in that, in the example of FIG. 17, the connections of the electrodes g1 and g1b, on the one hand, and g2 and g2b, on the other hand, are reversed in relation to the device of FIG. 15. In other words, in the example of FIG. 17, the electrodes g1 and g1b are formed by the conductive regions 116 and 114 respectively, and the electrodes g2 and g2b are formed by the conductive regions 116' and 114' respectively. In this example, in the rest position, the capacitance Csd between the electrode r and the electrode d is at its low value CsdL, and the capacitance Csdb between the electrode r and the electrode db is at its high value CsdbH.

The operation of the device of FIG. 17 is similar to that of FIG. 15, except that, in the example of FIG. 17, the signals A and B must both be in the logic state 1 (with the signals Ab and Bb then being in the logic state 0) in order to have the flexible beam 112 switch to the right, and thus the output logic signal S to the logic state 1 (and the logic signal Sb to the state 0). This corresponds to the implementation of a logic function AND (S=A.B).

The device of FIG. 17 can also be used to implement a function NOT AND by simply reversing the connections of the electrodes d and db, that is, by connecting the electrode d to the terminal supplying the signal S and the electrode db to the terminal supplying the signal Sb. This also applies to the device of FIG. 16.

Example embodiments of logic cells of the buffer or inverter type, or cells adapted to implement combinatorial logic functions, have been described above.

In a variant, the examples described above can be adapted to implement adiabatic capacitive logic memory cells with complementary control by using mechanically bistable structures of the type described in the above-mentioned patent application EP3624123, that is, structures comprising only two stable equilibrium positions without electrical polarization. In particular, the use of such structures makes it possible to maintain the state of the cells even when no input signal is applied or when the supply voltage is interrupted.

Figure 18:
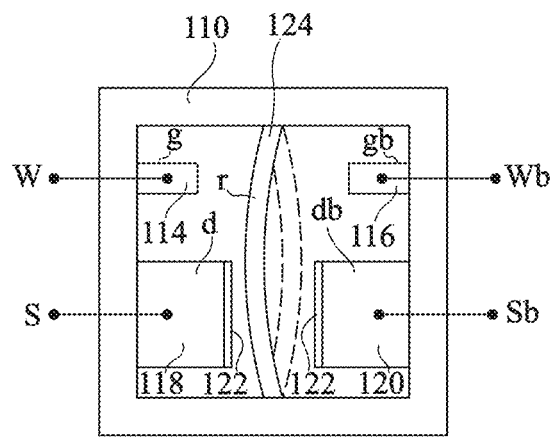
FIG. 18 illustrates an example embodiment of a five-electrode variable capacitance device for producing a memory cell adiabatic with capacitive logic according to one embodiment.

FIG. 18 illustrates a (non-limiting) example embodiment of a variable capacitance microelectromechanical device of the bistable type that makes it possible to implement am adiabatic capacitive logic memory cell with complementary control.

The device of FIG. 18 comprises the same elements as the device of FIG. 12A, arranged in substantially the same manner, and differs from the device of FIG. 12A primarily in that, in the device of FIG. 18, the flexible beam 112 of the device of FIG. 12A has been replaced by a mechanically bistable conductive beam 124. The beam 124 is pre-stressed at manufacture, for example. The beam 124 comprises two layers (not detailed in the Figure) of materials having different thermal expansion coefficients, for example. The two stable equilibrium positions of the beam 124 are shown in solid and dashed lines in FIG. 18, respectively.

In the example of FIG. 18, the electrodes g and gb are connected to a terminal for supplying an input logic signal W and a terminal for supplying an input logic signal Wb, respectively, complementary to the signal W. The electrodes d and db are connected to a terminal for supplying an output signal S and to a terminal for supplying an output signal Sb, respectively, complementary to the signal S. The signals W and Wb allow the beam 124 to move from one to the other of its two stable equilibrium positions. The mechanical bistability of the beam 124 makes it possible to preserve the information in the absence of electrical power to the cell, or when the input signals W and Wb are left floating.

It will be noted that the device in FIG. 18 forms a five-electrode microelectromechanical device that can be integrated into a cell of the type described in connection with FIG. 9. The supply voltage VPC can then be applied to the electrodes d and db via fixed capacitance capacitors. In a variant, the bistable conductive beam 124 may support two disjoint electrodes r and s, arranged between the electrodes g and gb and between the electrodes d and db respectively. This results in a six-electrode device that can be integrated into a cell of the type described in connection with FIG. 7. The supply voltage VPC can then be applied directly to the electrode s.

Example embodiments of variable capacitance microelectromechanical devices with complementary control have been described above in which variation of the capacitances Csd and Csdb is obtained by varying the gap between the electrodes of said capacitances without varying the area opposite said electrodes.

In a variant, the embodiments described may be implemented by variable capacitance microelectromechanical devices in which variation of the capacitances Csd and Csdb is obtained by varying the surface of the movable electrode s or r opposite the fixed electrodes d and db. Example embodiments (not limiting) of such devices are described below in connection with FIGS. 19 and 20.

Figure 19:
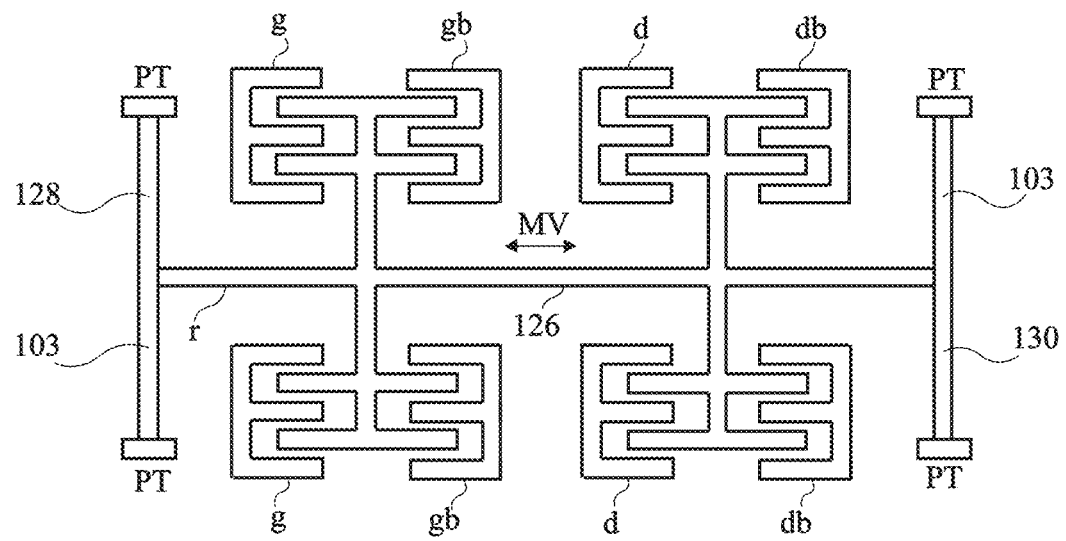
FIG. 19 illustrates in more detail another example embodiment of the five-electrode variable capacitance device of FIG. 8.

FIG. 19 illustrates in more detail another example embodiment of the five-electrode variable capacitance device of FIG. 8.

In this example, the electrodes d and r, on the one hand, and db and r, on the other hand, are shaped like interdigitated combs. Furthermore, in this example, the electrodes g and r on the one hand, and gb and r on the other hand, are also shaped like interdigitated combs. More particularly, in this example, the electrode r comprises a plurality of comb-shaped conductive regions interdigitated with comb-shaped conductive regions forming the electrodes g, gb, d and db, respectively. The combed regions of the electrode r are connected to a single rigid conductive beam 126. The beam 126 is attached at its ends to flexible beams 128 and 130, forming a spring 103 for returning the device to its rest position. In this example, the flexible beams 128 and 130 are attached at their ends to the fixed points PT of the structure.

In the example shown in FIG. 19, the movable structure is adapted to move in a direction MV parallel to the teeth of the interdigitated combs. Specifically, in the example shown, when a high-level voltage is applied to the electrode g and a low-level voltage is applied to the electrode gb, the electrode r is attracted to the electrode g by electrostatic effect. As a result, the comb teeth surface of the electrode d opposite the comb teeth of the electrode r increases, while the comb teeth surface of the electrode db opposite the comb teeth of the electrode r decreases. Thus, the capacitance Csd (between the electrodes r and d) increases and the capacitance Csdb (between the electrodes r and db) decreases. Conversely, when a low-level voltage is applied to the electrode g and a high-level voltage is applied to the electrode gb, the electrode r is attracted to the electrode gb by electrostatic effect. As a result, the comb teeth surface of the electrode d opposite the comb teeth of the electrode r decreases, while the comb teeth surface of the electrode db opposite the comb teeth of the electrode r increases. Thus, the capacitance Csd (between the electrodes r and d) decreases and the capacitance Csdb (between the electrodes r and db) increases.

Figure 20:
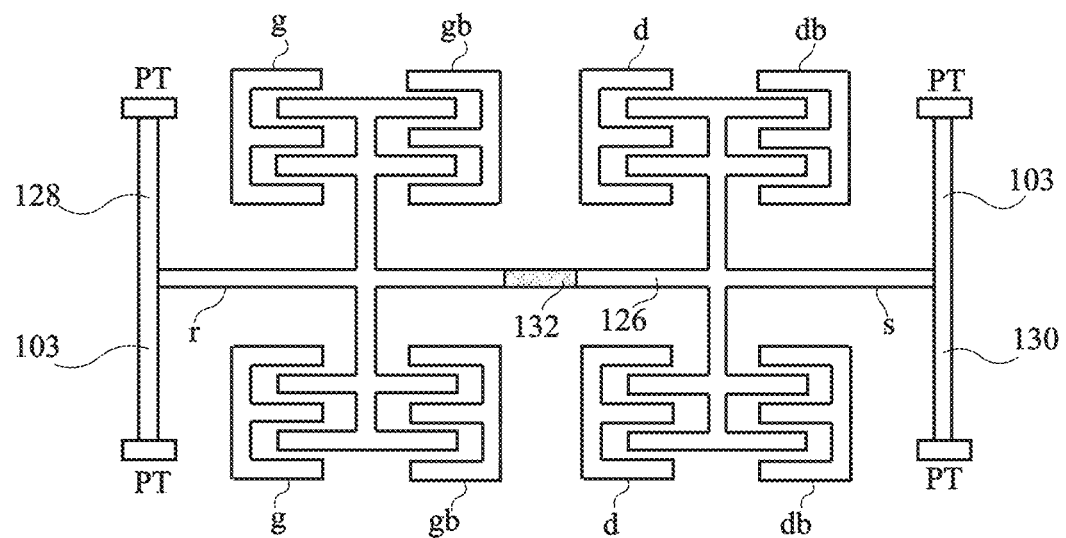
FIG. 20 further illustrates another example embodiment of the six-electrode variable capacitance device of FIG. 6.

FIG. 20 further illustrates another example embodiment of the six-electrode variable capacitance device of FIG. 6.

The device of FIG. 20 comprises the same elements as the device of FIG. 19, arranged in substantially the same manner.

The device of FIG. 20 differs from the device of FIG. 19 primarily in that, in the device of FIG. 20, the comb conductor regions of the movable structure interdigitated with the electrodes g and gb are isolated electrically from the comb conductor regions of the movable structure interdigitated with the electrodes d and db. The comb conductor regions of the moving structure interdigitated with the electrodes g and gb define the electrode r, while the comb conductor regions of the moving structure interdigitated with the electrodes d and db define the electrode s. In this example, the electrical insulation between the electrodes s and r is provided by a dielectric region 132, integral with the rigid beam 126.

An advantage of the above-embodiments described is that the logic state differentiation is made much more robust due to the use of complemented logic signals applied to the same microelectromechanical device with at least five electrodes.

This makes it possible to relax the geometrical precision constraints on producing microelectromechanical devices, in particular.

This also makes it possible to significantly reduce the voltage levels used insofar as the difference in voltage level between the logic states 1 and 0 can be reduced.

Furthermore, the use of complemented signals makes it possible for the logic activity to be decoupled from the power consumption of the logic circuit. This makes it more difficult to estimate logic levels in the event of an attack by analyzing power consumption.

More generally, the embodiments described above can be adapted to implement more complex logic functions, such as logic functions with n complemented inputs, with n an integer greater than or equal to 3.

Figure 21:
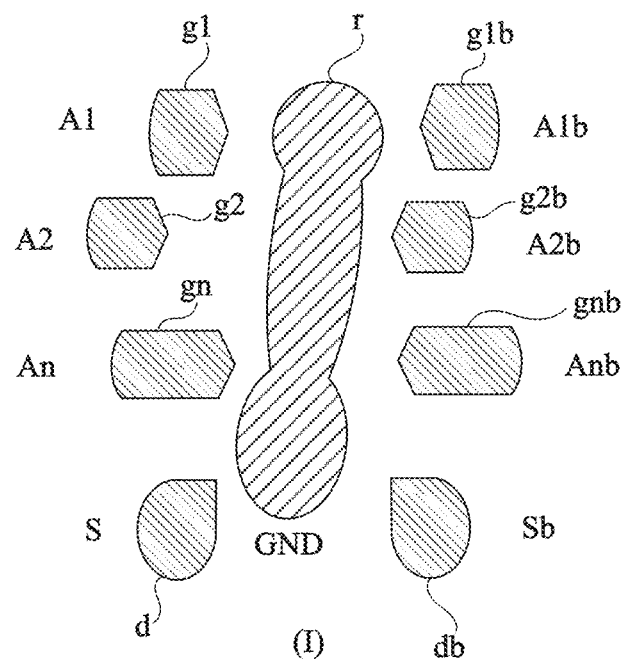
FIG. 21 is a schematic illustration of another example of a capacitive logic cell according to one embodiment.
Figure 21:
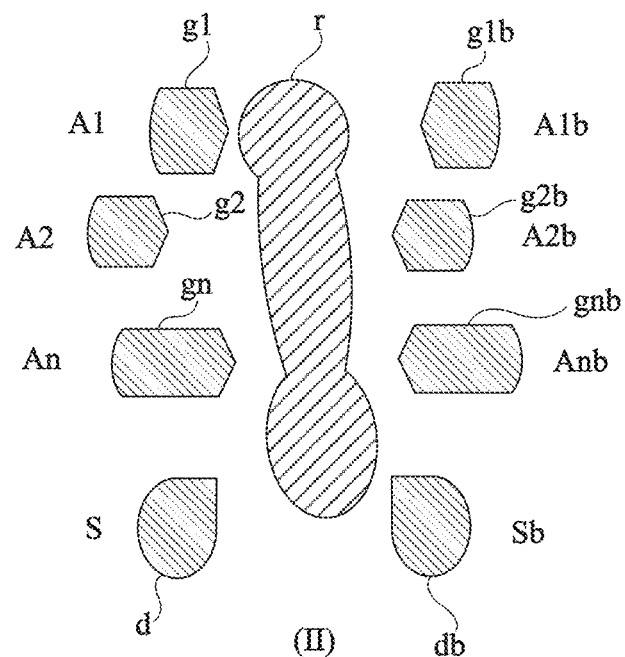

FIG. 21 illustrates an example of a variable capacitance device for producing an adiabatic capacitive logic cell with n complemented inputs. FIG. 21 comprises two device views (I) and (II), respectively, in two different operating positions.

The device of FIG. 21 comprises n pairs of fixed electrodes gi, gib, with i an integer ranging from 1 to n. The n electrodes gi are intended to receive n distinct input logic signals Ai, respectively. The n electrodes gib are intended to receive n input logic signals Aib, respectively, complementary to the signals Ai.

The device of FIG. 21 also comprises a mobile central electrode r that can assume one or other of two stable positions (shown in view (I) and in view (II)), respectively, according to the states of the input logic signals Ai, Aib applied to the n pairs of fixed electrodes gi, gib. The electrode r is intended to be connected to a fixed reference potential GND such as ground, for example.

The device of FIG. 21 further comprises two fixed electrodes d and db intended to provide an output logic signal S and an output logic signal Sb, respectively, complementary to the signal S. The electrodes r and d define a first variable output capacitance, and the electrodes r and db define a second variable output capacitance.

The value of the output logic state is read from the electrodes d and db (the signals S and Sb), and depends on the respective values of the first and second output variable capacitances. The two respective output logic states correspond to the two possible equilibrium positions of the mobile electrode r.

A suitable choice of electrode shapes and positions makes it possible to make a logic function with a complemented output that has the n complemented logic signals Ai, Aib as inputs. The logic function made can be an AND, OR, NAND or NOR function. In a variant, more complex functions can be made.

Figure 22:
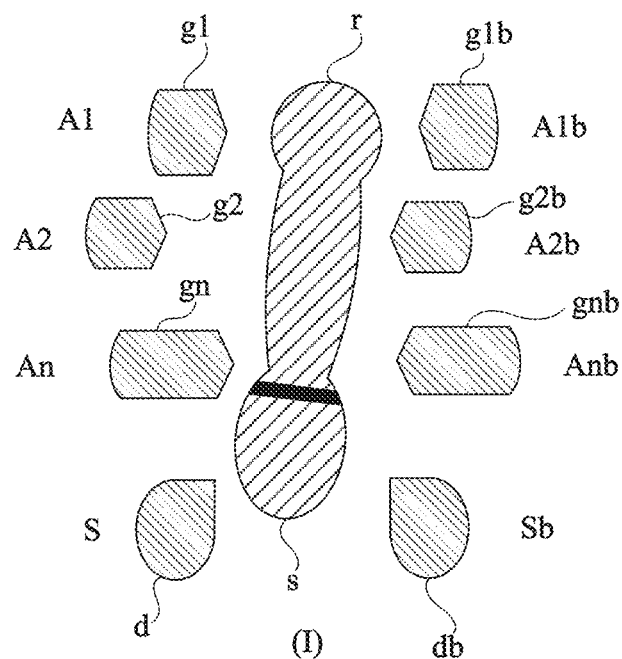
FIG. 22 illustrates a variant embodiment of the cell of FIG. 21.
Figure 22:
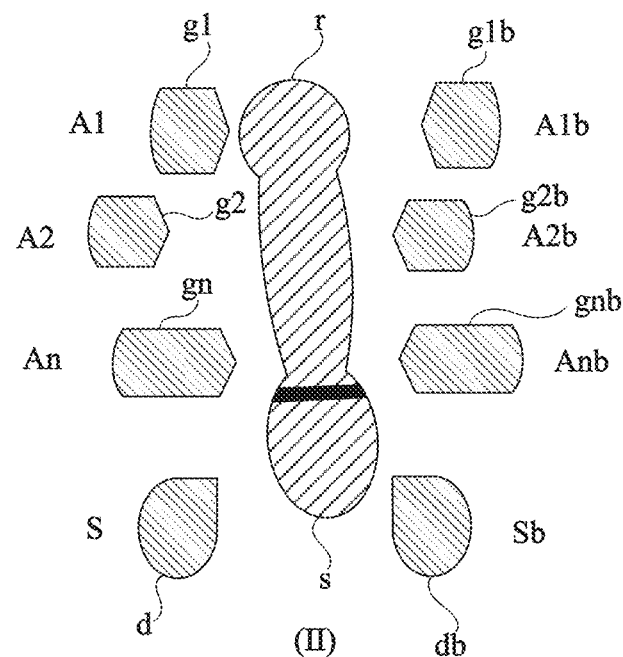

FIG. 22 illustrates a variant embodiment of the device of FIG. 21. FIG. 22 comprises two device views, (I) and (II), respectively, in two different operating positions.

The variant of FIG. 22 differs from the example of FIG. 21 mainly in that, in this variant, the movable part comprises two differentiated electrodes r and s, that is, electrically insulated from each other. The electrode r is placed opposite the electrodes gi, gib, while the electrode s is placed opposite the electrodes d and db. In this case, the supply voltage VPC can be applied directly to the electrode s in a manner similar to that described above, specifically in connection with FIG. 7.

Various embodiments and variants have been described. It will be understood by the person skilled in the art that some features of these various embodiments and variants could be combined, and other variants will be apparent to the person skilled in the art. In particular, although only example embodiments of electrostatically controlled variable capacitance devices have been described, the embodiments are not limited to this particular case. In particular, the person skilled in the art will know how to adapt the embodiments described to piezoelectrically driven or electrodynamically driven variable capacitance devices, as described in connection with FIG. 6 of the aforementioned patent application EP3416175, for example.

In addition, although not detailed above, the electrodes of the above-described electro-mechanically driven variable capacitance devices may be fully or partially covered with an electrical insulator.

Furthermore, although only examples have been described of electromechanically controlled variable capacitance devices above in which the movable part is movable in a single translational degree of freedom in relation to the fixed part, the embodiments described are not limited to this particular case. In a variant, the movable part may be movable in rotation in relation to the fixed part.

Furthermore, the embodiments described are not limited to the logic function examples mentioned in the present description. In particular, the person skilled in the art will know from the teachings of the present description how to implement more complex logic functions, with more than two inputs for example, by a single electromechanically controlled variable capacity device.

In addition, more complex logic functions may be implemented from combined elementary logic cells of the type described in the present application, such as cells of the AND, OR, NOT AND and/or NOT OR type.

Furthermore, it will be noted that the embodiments described are compatible with architectures that use periodic variable supply voltages, known as retractable, also known as Bennett clocking architecture, such as the type described in connection with FIG. 9 of patent application EP3654534.

It should also be noted that the electromechanically controlled variable capacitance devices described above can be used in liquid media. In this case, the fixed electrodes are separated from the moving electrodes by a liquid. In particular, this reduces the voltage levels required to switch between the logic states 1 and 0 of the signals, and ensures better electrode displacement linearity, depending on applied voltage.

In a variant, the electromechanically controlled variable capacitance devices described above can be used in a gaseous or vacuum environment.

What is claimed is:

1. A capacitive logic cell with complementary control comprising a variable capacitance electromechanical device comprising a fixed part and a movable part, the electromechanical device comprising first, second, third, and fourth electrodes mounted on the fixed part, and a fifth electrode mounted on the movable part, wherein the first electrode is connected to a terminal for supplying a first input logic signal of the cell, the second electrode is connected to a terminal for supplying a second input logic signal of the cell, complementary to the first input logic signal, the third electrode is connected to a terminal for supplying a first output logic signal of the cell, and the fourth electrode is connected to a terminal for supplying a second output logic signal of the cell, complementary to the first output logic signal.

2. The cell according to claim 1, wherein the third and fifth electrodes define a first capacitance variable, depending on the position of the movable part in relation to the fixed part, and the fourth and fifth electrodes define a second capacitance variable, depending on the position of the movable part in relation to the fixed part.

3. The cell according to claim 1, wherein the position of the movable part in relation to the fixed part depends on the state of the first and second complementary input logic signals applied to the first and second electrodes, respectively.

4. The cell according to claim 1, wherein the movable part is movable in relation to the fixed part so as to vary the distance between the third and fifth electrodes and the distance between the fourth and fifth electrodes without varying the surface of the third electrode opposite the fifth electrode or the surface of the fourth electrode opposite the fifth electrode.

5. The cell according to claim 1, wherein the movable part is movable in relation to the fixed part so as to vary the area of the fifth electrode opposite the third electrode and the surface of the fifth electrode opposite the fourth electrode without varying the distance between the third and fifth electrodes or the distance between the fourth and fifth electrodes.

6. The cell according to claim 1, further comprising a terminal for supplying a periodic variable supply voltage and a terminal for supplying a reference potential.

7. The cell according to claim 6, wherein the fifth electrode is connected to terminal for supplying the reference potential, and the third and fourth electrodes are connected to the terminal for supplying the variable supply voltage via first and second fixed capacitance capacitors, respectively.

8. The cell according to claim 6, wherein the variable capacitance electromechanical device comprises a sixth electrode mounted on the movable part, the sixth electrode being connected to the terminal for supplying the reference potential and the fifth electrode being connected to the terminal for supplying the periodic variable supply voltage.

9. The cell according to claim 1, wherein the movable part comprises a flexible beam anchored to a fixed support at one of its ends at least.

10. The cell according to claim 1, wherein the movable part comprises a mechanical bistable element.

11. The cell according to claim 1, wherein the third, fourth and fifth electrodes are in the shape of interdigitated combs.

12. The cell according to claim 1, wherein the electromechanical device further comprises seventh and eighth electrodes mounted on the fixed part, wherein the seventh electrode is connected to terminal for supplying a third input logic signal of the cell and the eighth electrode is connected to a terminal for supplying a fourth input logic signal of the cell, complementary to the third input logic signal.

13. The cell according to claim 12, wherein the electromechanical device further comprises ninth and tenth electrodes mounted on the fixed part, wherein the ninth electrode is connected to a terminal for supplying a third input logic signal of the cell and the eighth electrode is connected to a terminal for supplying a fourth input logic signal of the cell, complementary to the third input logic signal.

14. A logic circuit comprising first and second logic cells according to claim 1, wherein the first cell has its terminal for supplying the first output logic signal and its terminal for supplying the second output logic signal respectively connected to the terminal for supplying the first input logic signal and to the terminal for supplying the second input logic signal of the second cell.

\* \* \* \* \*